United States Patent [19]

Marshall, Jr.

[11] Patent Number: 4,491,084
[45] Date of Patent: Jan. 1, 1985

[54] APPARATUS FOR SOLDER TINNING OF COMPONENT LEADS

[75] Inventor: George C. Marshall, Jr., Claremont, Calif.

[73] Assignee: General Dynamics, Pomona Division, Pomona, Calif.

[21] Appl. No.: 427,095

[22] Filed: Sep. 29, 1982

[51] Int. Cl.³ .............................................. B05C 11/00
[52] U.S. Cl. .................................... 118/683; 118/74; 118/703; 118/424
[58] Field of Search .................... 427/156; 118/73, 74, 118/424, 429, 693, 694, 683, 682, 703; 156/584, 344, 247, 278, 297, 559, 560, 561; 206/330, 331, 813

[56] References Cited

U.S. PATENT DOCUMENTS

| | | | |
|---|---|---|---|
| 2,834,317 | 5/1958 | Eger et al. | 100/194 |
| 2,929,130 | 3/1960 | Packman | 29/25.42 |
| 2,935,962 | 5/1960 | Deitrick et al. | 118/74 |
| 2,949,388 | 8/1960 | Flournoy, Jr. et al. | 29/424 |
| 2,954,117 | 9/1960 | Freeburg | 206/56 |
| 3,007,440 | 11/1961 | Naven et al. | 118/503 |
| 3,168,885 | 2/1965 | Weiss | 118/421 |
| 3,394,441 | 7/1968 | Weiss | 29/25.42 |
| 3,499,220 | 3/1970 | Hintz et al. | 29/573 |
| 3,710,753 | 1/1973 | Birchall et al. | 118/2 |
| 3,817,782 | 6/1974 | Klein et al. | 361/433 |
| 3,826,227 | 7/1974 | Allison | 118/60 |
| 3,828,419 | 8/1974 | Wanner | 118/400 |
| 3,923,071 | 12/1975 | Lada | 118/694 |
| 3,967,000 | 6/1976 | Klein et al. | 427/58 |
| 3,995,588 | 12/1976 | Booz et al. | 118/74 |
| 4,127,680 | 11/1978 | Shirn et al. | 427/79 |

Primary Examiner—Michael R. Lusignan
Assistant Examiner—K. Jaconetty
Attorney, Agent, or Firm—Henry M. Bissell; Edward B. Johnson

[57] ABSTRACT

Method and apparatus which allows the component leads of pre-taped electronic components to be solder tinned to preserve the solderability and shelf life of such component leads. Pre-taped electronic components and the like are prepackaged in a reel and positioned in the apparatus such that the reel is free to rotate. Both leads of each component are secured to corresponding adjacent component leads by tape. The electronic components are moved through a plurality of processing stages such that one lead of each component is solder tinned, one of the processing stages removing the tape from the leads to enable the soldering thereof. After soldering of the leads, tape is applied thereto. The process is then repeated for the other leads of each component.

25 Claims, 9 Drawing Figures

4,491,084

APPARATUS FOR SOLDER TINNING OF COMPONENT LEADS

BACKGROUND OF THE INVENTION

1. Field of the Invention

This invention relates to the processing of electronic components and, more particularly, to methods and apparatus for solder tinning component leads.

2. Description of the Prior Art

The utilization of electronic components in a wide variety of devices has continually increased from year to year. The electronic components usually have suitable lead wires attached thereto to enable the component to be mounted on printed circuit boards, for example, the lead wires being soldered to appropriate points on the opposite side of the printed circuit board. When the desired number of electronic components have been inserted in the printed circuit board and the soldered connections have been made, the assembly so formed is then ready for incorporation in the device being manufactured.

In general, manufactured electronic components, such as axial lead resistors, are pre-packaged in a reel with opposite component leads being secured by tape. These reels are then sold to distributors or manufacturers for incorporation into electrical devices being manufactured. Situations arise, however, wherein the reel itself or the components on the reel are not utilized for extended periods of time. In this case, depending on the type of coating on the component leads, the leads may be quite unsuitable for making reliable electrical connections when the components are installed in electrical circuits, as in printed circuit boards and the like. For example, the leads of electrical components, as manufactured today, are frequently coated with a plated layer which does not have a long shelf life insofar as solderability in the making of circuit connections is concerned. Modern fabrication techniques often deposit this layer by electroless nickel plating or by electrolytic tin or nickel plating. Rather than being a continuous layer, the result is likely to be a surface of discontinuous microscopic balls or globules which, if solderable upon fabrication, become degraded within a short time to the point where satisfactory solder connections cannot be reliably and consistently formed. In such cases the shelf life is relatively short; typically within six months a large proportion of such leads are unsolderable because of the development of oxidation and other inhibiting properties.

There are other instances of fabricated electronic components intended for ultimate use by installation in electrical circuits by means of soldered connections where it is necessary to remove an outer incompatible layer before the leads can be soldered. An example of such is a gold plating layer formed over a base lead of brass or copper, such as occurs in certain components which include a plated layer of gold as a constituent element of the component and wherein the gold plating is continued externally of the component onto the base metal lead. While gold is a solderable material, it may tend to embrittle the solder joint, particularly where the gold layer exceeds a certain thickness. Thus certain Mil-Specs require that a gold plated layer be removed in preparing component leads for solder connections. While this can be accomplished by immersing the lead in a solder bath which at the same time solder-tins the base lead, the process of treating each component lead in this fashion on an individual basis can be quite laborious and costly.

Conventional techniques for solder tinning component leads have been almost, if not entirely, discontinuous in nature and involve relatively delicate, tedious and time-consuming hand operations of limited production which contribute materially to the cost of the finished product. In particular, handling each component to pre-clean, flux, solder, post-clean and re-package the components necessitates a considerable amount of labor. However, certain Mil-Specs require that the electrical connection to a component lead be completed by soldering to develop a fused coating. Thus it has been necessary heretofore, when fabricating electronic circuitry to these Mil-Specs, to prepare the component leads in this fashion.

U.S. Pat. No. 2,954,117 provides a technique for manufacturing a wafer-type capacitor using mass production techniques and in particular calls for at least one terminal of the electrical circuit component being securely fastened to a carrier member until the time it may be desired to remove the circuit component for permanent assembly in a selected electrical device. The carrier member moves the terminal leads through various fabricating steps or stations as the capacitor is being manufactured. Although the process disclosed in this patent provides an automated technique for fabricating electrical circuit components such as capacitors, the special requirements for solder tinning a component lead to preserve the solderability and to prolong the shelf life of a component lead and, in particular, the necessary step of removing tape from both sides of the terminal lead to allow solder tinning thereof and the re-application of the tape after the processing has been completed is not disclosed.

U.S. Pat. No. 3,394,441 also discloses a method of manufacturing capacitors wherein a web conveyor is provided to continuously position, transfer, introduce and remove capacitor constituent elements and progressively form sub-assemblies thereof relative to a plurality of sequentially arranged, cyclically operable and adjacently positioned operating stations. The sequential fabricating steps are concurrently and sequentially effected on the conveyor strip supported work pieces. Included in the process is a terminal wire sub-assembly forming an insertion station C wherein a length of terminal wire is formed and inserted into the terminal wire sub-assembly mounting slits in the web. As discussed hereinabove with respect to U.S. Pat. No. 2,954,117. U.S. Pat. No. 3,394,441 is solely concerned with the manufacturing of components and does not address the problem of solder tinning a component lead to preserve the solderability and to prolong the shelf life thereof.

U.S. Pat. No. 3,995,588 describes a technique for coating the axially extending leads of a sealed contact with solder to protect them from contamination and to enhance their solderability into circuits. The sealed contact is transported along various processing stations in the apparatus disclosed. However, as with the aforementioned patents, U.S. Pat. No. 3,995,588 does not address the problem of removing tape from component lead already solder tinned to allow the subsequent tinning of the leads.

U.S. Pat. No. 2,929,130 discloses a process for mass producing small electronic components such as resistors or capacitors. The electronic components pass through a series of consecutive stages, the objects being attached individually to a strip of flexible material which is led through the stages of manufacture and which is driven so as to convey the objects, one after the other, through the stages. A suitable material for the strips as disclosed is paper. As set forth hereinabove with respect to the aforementioned patents, U.S. Pat. No. 2,929,130 does not disclose a technique for removing standard tape attached to each end of the axial lead component to tin the component leads.

What is therefore desired is a technique which operates in conjunction with a plurality of electronic components which have been secured together by tape in a manner such that the tape covering at least one of the leads of each component is removed and such that the component lead can then be solder tinned to preserve the solderability of the lead and also to prolong its shelf life.

SUMMARY OF THE INVENTION

In brief, arrangements in accordance with the present invention comprise methods and apparatus which allow the component leads of pre-taped electronic components to be solder tinned to preserve the solderability and shelf life of the component leads. Such electronic components and the like are prepackaged in a reel and positioned in the apparatus such that the reel is free to rotate. The components are supported by carrier means and initially subjected to solvent spray applied to the tape holding one of the two leads of each component. The tape is then removed and the removed tape discarded. The components, with the remaining tape holding the other component leads in place, are carried through a number of processing stages including a pre-clean solvent station, a flux station, a hot solder station and a flux removing solvent station. Each station includes a nozzle having a narrow slot therein through which the component leads pass. The electronic components are then carried past air nozzles that dry the solvent from the component leads. The electronic components are driven in a continuous manner by drive means which pull the electronic components via the tape holding the other leads through the apparatus. Means are also provided to apply new tape onto the component leads from which tape was initially removed. The electronic components are then wound onto a reel and a backup protective layer is applied thereto. The reel is then removed from the apparatus and placed at the initial point of the apparatus in an inverted manner and the process is repeated such that the component leads which have not been acted upon can be tinned in the manner described hereinabove.

In one embodiment, the drive means comprises a drive gear. In another embodiment, the drive means comprises two drive sprockets, each driving chains and a plurality of pad members affixed to the chains, the pad members squeezing the driven tape and a portion of the component leads, the gripping or squeezing action coming from a pair of back-up bars and associated springs.

BRIEF DESCRIPTION OF THE DRAWING

A better understanding of the present invention may be had from a consideration of the following detailed description, taken in conjunction with the accompanying drawing in which.

DESCRIPTION OF THE PREFERRED EMBODIMENT

Figures 1, 1A:
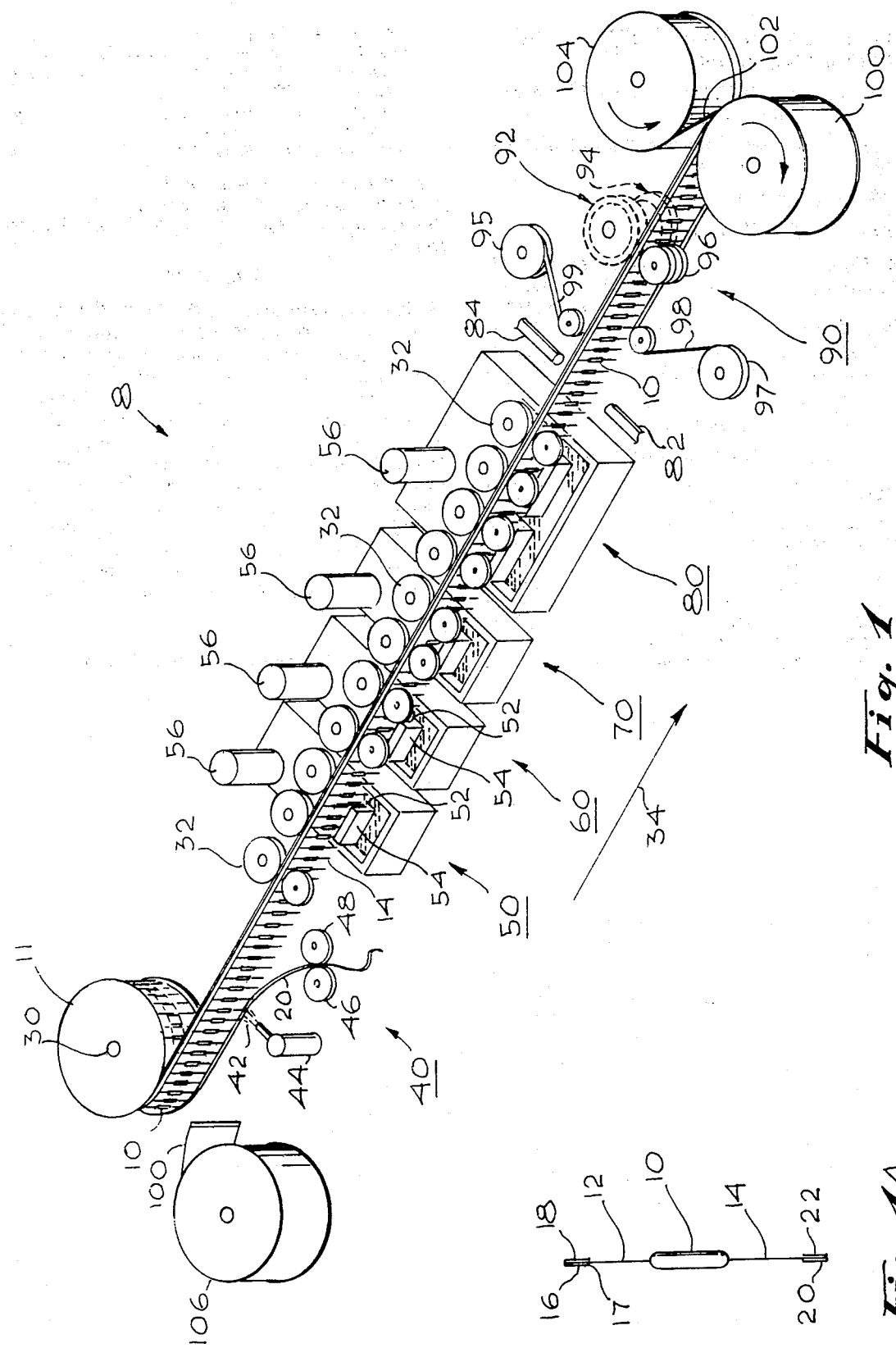
FIG. 1 is a simplified perspective view of the apparatus of the present invention illustrating the various steps in the process of solder tinning leads on electronic components.
FIG. 1A illustrates a side view of a tape supported electronic component.

FIG. 1, is a perspective view illustrating the various stages in the process of solder tinning leads on electronic components. Although the method and apparatus illustrated can be utilized to solder tin electronic components during the course of fabrication of electronic components, the present invention is particularly adapted to solder tin leads of electronic components, such as resistors, capacitors, diodes and the like, which have already been tinned and stored for future use but due to various circumstances, including normal wear and tear during shelf storage, part or all of its original tinning has been removed, thus making the electronic components unsuitable for use when mounted in printed circuit boards.

As shown in FIG. 1, a plurality of electronic components 10 is presented to the apparatus 8 of the present invention in the form of reel 11 with paper tape mounted on the outer end of leads 12 and 14 of each component. FIG. 1A shows an end view of the tapes mounting one electronic component 10 having leads 12 and 14. Paper tapes 16 and 18 (referred to hereinafter as upper tape 16) are bonded together to hold the end terminal portion of lead 12 and paper tapes 20 and 22 (referred to hereinafter as lower tape 20) are bonded together to hold the end terminal portion of lead 14. Upper tape 16 and lower tape 20, as formed on reel 11, comprise an elongated strip of tape which secure corresponding adjacent electronic component leads together on reel 12. FIG. 1A, in essence, illustrates how an electronic component 10 has been packaged on the reel 11 as it enters the initial processing stage of apparatus 8.

Reel 11, containing the pre-taped electronic components 10, is placed on a rotatable axis 30, the taped electronic components being fed into a carrier, or support, means 32. Thus, as will be set forth with respect to FIG. 2 hereinafter, carrier means 32 acts to support the electronic components 10 as they are transported in the direction of arrow 34.

At the first processing stage, or station, indicated by reference numeral 40, a solvent spray 42, emitted from container 44, is applied to the lower tape portion 20 which is then removed by two rotating wheels 46 and 48 and discarded.

The electronic components 10, via the plurality of carrier means 32, continue through to the next processing station 50 (the pre-clean solvent station). The lower component lead 14 passes through a slot 52 in the nozzle 54 in a continuous manner. Solvent is pumped by pump 56 up through the nozzle 54 creating an agitating cleaning flow. The details of the nozzle 54 are set forth hereinbelow with respect to FIG. 4.

After the pre-clean operation at station 50, the electronic components 10 are moved to the next station 60 which adds flux to lower lead 14 of each component. Lead 14 passes through slot 52 in nozzle 54 as illustrated (since the operation and design of the nozzles in each station described are identical, identical reference numerals for each of the four nozzles shown have been utilized). After the fluxing operation, the electronic components 10 are moved to station 70 which contains hot solder, the hot solder being applied to the leads 14 in a manner described hereinafter with reference to FIG. 4. The electronic components 10, after the application of hot solder to the lower leads 14, are moved to the next station, indicated by reference numeral 80, station 80 containing the flux removal solvent which is applied to lower leads 14 in the manner described hereinafter with reference to FIG. 4.

The carrier means then carries electronic components 10 on and through air nozzles 82 and 84 which dry the solvent from the component leads 14. The electronic components 10 continue to the next station, indicated by reference numeral 90, where a cog wheel 92 acts as a drive cog wheel to pull the upper tape 16 in a continuous manner along with the components attached thereto through the remainder of the stations. The cog wheel 94 and back-up wheel 96 act to position and apply new tapes 98 and 99 on both sides of lower lead 14 from supply reels 95 and 97, respectively. The thus taped components 10 are then wound onto a reel 100 with back-up protective paper 102 from spool 104. Paper 102 prevents the components from rubbing together as they are wound onto reel 100. In order to solder tin the opposite, or upper, lead 12, reel 100 is inverted, placed in a holder (represented by reference numeral 106) and run back through apparatus 8. Alternatively, the taped components can be slowly rolled over and continued through a second apparatus identical to apparatus 8. It should be noted that most reels containing the pre-taped electronic components already have back-up protective paper included therewith. Although FIG. 1 does not show a device for removing the protective paper prior to the electronic components 10 entering the first processing stage 40, the configuration of such a device is similar for that shown in processing stage 40 for removing the tape.

Figure 2:
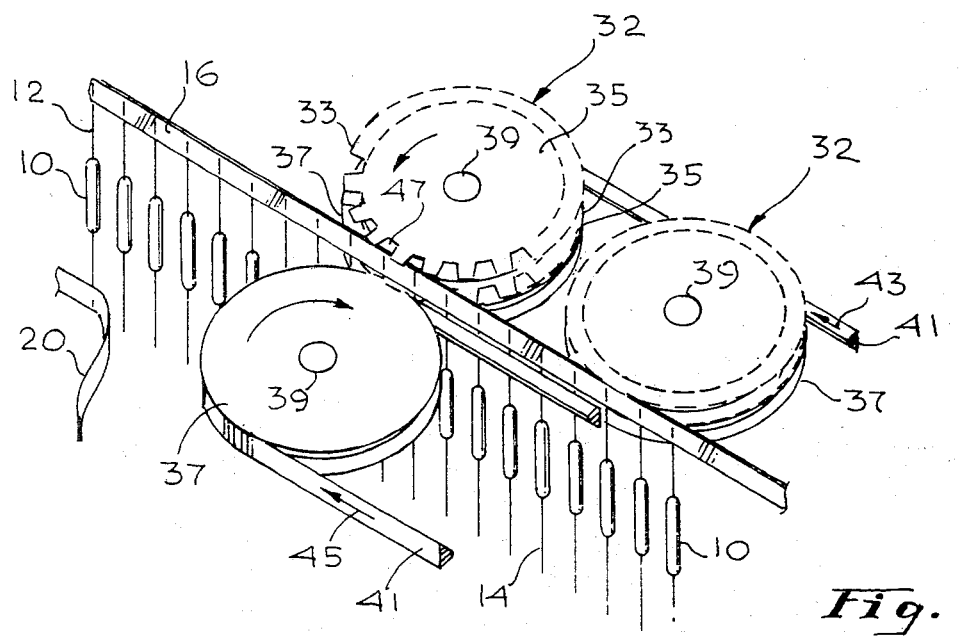
FIG. 2 is a partial perspective view of a portion of the carrier means carrying electronic components with the upper tape in place and the lower tape removed.
Figure 3:
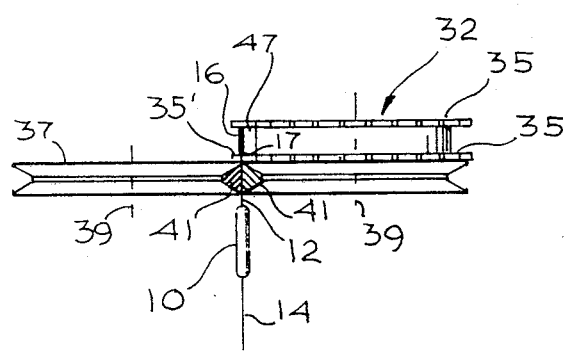
FIG. 3 illustrates a portion of the carrier means for locating and holding the electronic components.

Referring now to FIGS. 2 and 3, the details of the carrier means 32 and its associated mechanisms are illustrated. The electronic components 10, with the upper tape 16 being the only remaining tape, are fed through the carrier means 32 as illustrated. The carrier means 32 includes conveyor cogs 33 formed on two separate carrier wheels 35. The cogs 33 and the lower carrier wheel 35 slip under the upper tape 16, thereby supporting the components 10 as they move through the processing stations. Upper tape 16 moves through a notch 47 between the upper and lower carrier wheels 35. A pair of V-pulleys 37 are free to rotate on their axes 39. Two V-tape belts 41 are placed within the V-shaped pulleys and driven in the direction of arrows 43 and 45 which hold and support the electronic component leads 2 in a vertical direction as shown clearly in FIG. 3 to allow the processing steps at the various stations to be accurately and efficiently accomplished.

Figure 4:
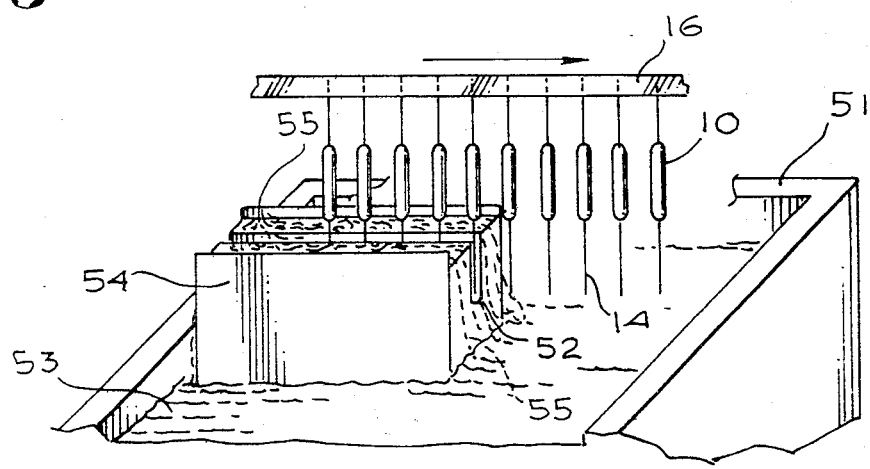
FIG. 4 is a perspective view of a nozzle utilized at the various process stages.

FIG. 4 illustrates the details of the processing stations 50, 60, 70 and 80. In particular, each of these processing stations includes a reservoir 51 which contains a material 53 to be applied to the lower leads 14 of the components 10. In the case of station 50, material 53 is a pre-clean solvent. Nozzle 54 is adapted to have a narrow longitudinal slot 52 allowing the relatively long, lower component leads 14 to move through the slot 52 continuously in a horizontal direction. The solvent 53 is then pumped up by pumps 56 through the nozzle 52 creating an agitating cleaning flow represented by reference numeral 55. The drive motor for each pump (not shown) includes an adjustment knob which allows the pump impeller to be raised or lowered with respect to the bottom of reservoir 51, which in turn controls the height and velocity of the material flow. This enables the nozzles to provide a smooth top surface of the solvent, flux, and solder with the height adjustment easily controlled. Furthermore, the relatively narrow slot 52 requires less fluid material 53 to be introduced into the solder spillway, thus requiring less power to be applied to the pump drive motor.

Figure 5:
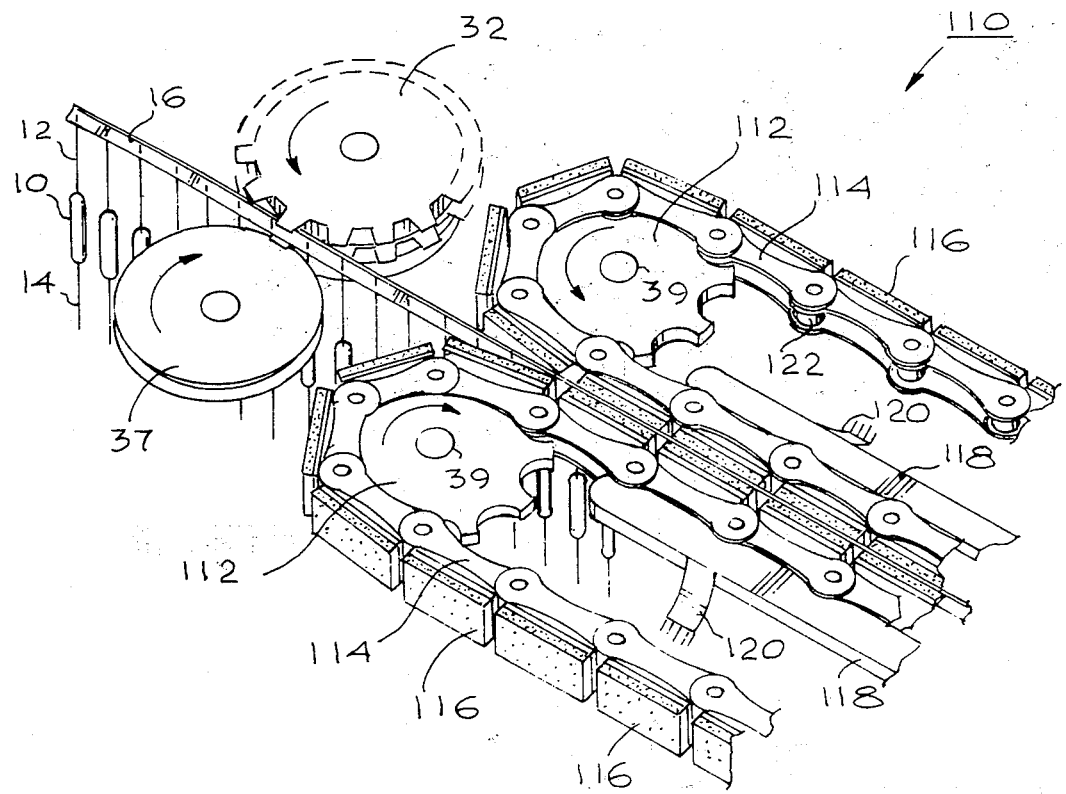
FIG. 5 is a perspective view of the alternate drive means of the present invention.
Figure 6:
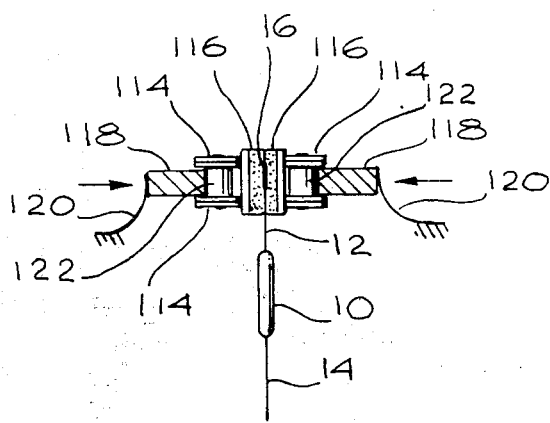
FIG. 6 is a partial elevation view illustrating how the drive means of FIG. 5 supports a component lead.

FIG. 5 is a partial perspective view of a drive means 110 which could be utilized in place of the drive gear 92 shown in FIG. 1. Carrier means 110 comprise drive sprockets 112 that drive endless chains 114 and a plurality of rubber pad members 116 affixed to the chains 114. As shown more clearly in FIG. 6, the rubber pad members 116 squeeze the upper tape 16 and a portion of the upper leads 12, holding the components rigid and in a substantially vertical direction to allow for accurate reapplication of tape to lower leads 14 (alternatively, drive means 110 may be positioned ahead of station 40 so that components 10 can be held rigid while the lower tape 20 is being removed). The gripping or squeezing action is provided by back-up bars 118 and springs 120. The carrier chains 114 are located and held in position by the back-up bars 118, the chain rollers 122 rotating on the back-up bars 118.

One of the features of the present invention is that the lower edge 17 (FIG. 1A) of the upper tape 16 is utilized to control the depth, or height, of the solder coating applied at station 70 in relation to the component body since edge 17 is supported by surface 35' of notch 47 (FIG. 3). The apparatus 8 as described also provides a constant and controllable time interval which each component lead 12 is submitted to the hot solder bath at station 70 due to the continuous and sequential manner in which each component lead is subjected to the solder bath as it moves in a horizontal (in contradistinction to an up-down or vertical) direction. Although not shown, means can be provided to allow the vertical position of carrier means 32 to be adjusted, thus allowing the height of the solder tin coating applied to the component leads to be controlled.

Figure 7:
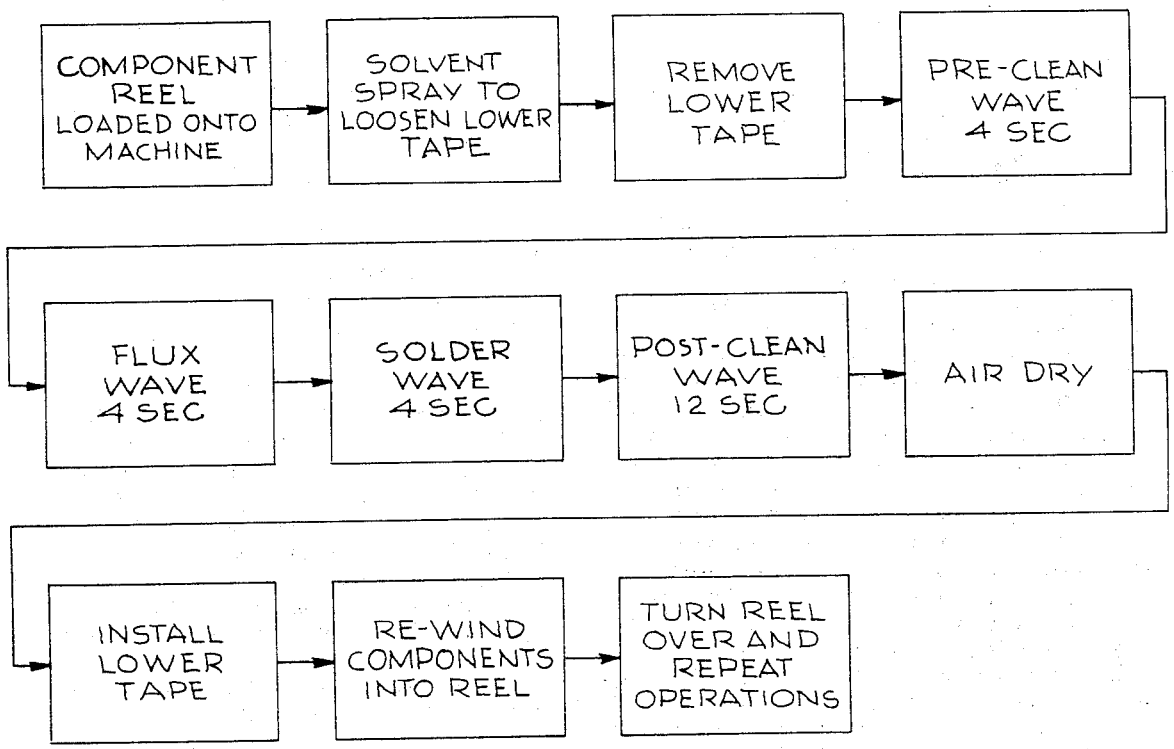
FIG. 7 is a block diagram illustrating specific steps of the method of the invention.

One particular method for tinning of component leads in accordance with the present invention is illustrated in the block diagram of FIG. 7. As shown therein, a reel of electronic components (in which the components are held in position next to each other by paper tapes which are bonded at least to the upper and lower axial leads of each component) is loaded onto the apparatus and the free end of the component reel tape is fed into the carrier. Next a solvent spray is applied to the tape on the lower component leads to dissolve the tape adhesive and the lower tape is removed as previously described. Carrier drive motion moves the components in succession to the pre-clean station, the flux station, the solder station and the post-clean station. At each of these stations, a bath of the appropriate liquid is provided in which a nozzle through which the individual component leads are directed develops a liquid wave. The procession of the carrier maintains each lower lead immersed in the liquid wave for a predetermined interval of time. In each of the pre-clean, flux and solder baths, this interval of immersion of an individual lead in the liquid wave is selected to be four seconds. In the bath of the post-clean station, the liquid wave is maintained in contact with the individual leads for a longer period of time, namely twelve seconds. Following this processing, the leads are air dried and new tape is installed on the lower leads equivalent to the tape which was originally applied. Thereafter, the tapes and components are wound onto a storage reel. After a complete reel of components has been processed by the apparatus in the manner described, the rewound reel is removed from the winding spindle, turned over and placed on a second supply spindle at the input end of the apparatus where the free end of the tape is fed into the carrier and the steps are repeated to remove the tape on the heretofore untreated leads and to process them in similar fashion.

It will be understood that the leads of these components, in general, are already plated by the manufacturer. However, in order to meet high grade specifications applicable to military equipment or other, similar standards of circuit quality and contact integrity, tinning of the component leads is essential. Heretofore, such tinning, including the removal of the tape from the individual component leads and reapplication of new tape after processing, has been an extremely arduous task. The handling of each component to pre-clean, flux, solder, post-clean and repackage requires a substantial amount of labor. This task has been substantially automated by the apparatus and methods of the present invention, with a resultant improvement in the uniformity and quality of the product, the speed with which the components are processed, and a substantial cost saving.

With the process of this invention, the glue on the adhesive tape is effectively removed from the component leads without contamination of the system. The solvent which is used to dissolve the adhesive leaves a slight adhesive residue on the leads. This residue does not contaminate the flux and it is removed in the soldering bath by the hot solder which is maintained at approximately 500° F. The residue adhesive floats to the top of the solder pot and can be removed, along with the dross, as appropriate (typically approximately twice each work shift). Tests have shown that the adhesive does not adversely effect the finished solder-coated leads.

Figure 8:
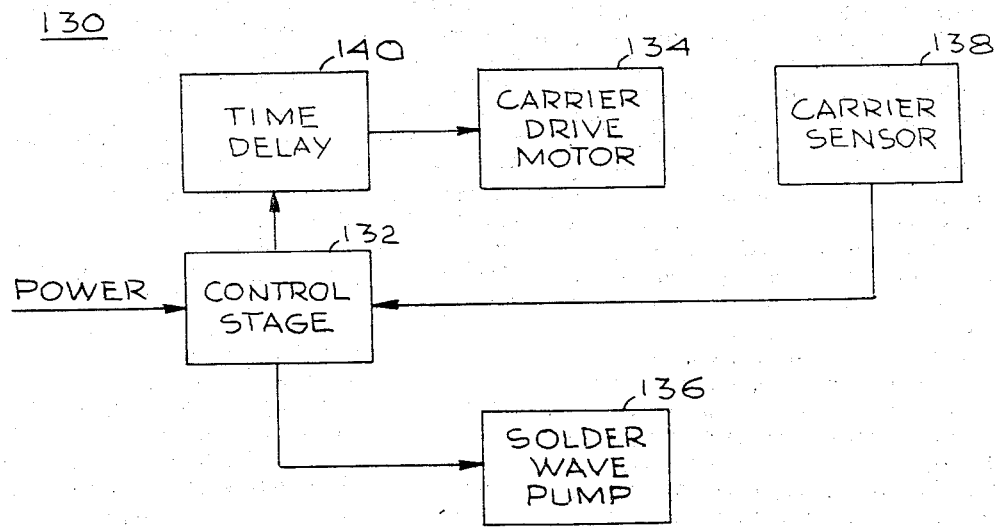
FIG. 8 is a block diagram illustrating a particular control arrangement utilized for the protection of the components being soldered.

It is important to protect the component from being overheated by the hot solder if the motion of the carrier is interrupted. FIG. 8 illustrates in block diagram form a particular circuit 130 for this purpose. The circuit 130 includes a control stage 132 which controls the application of electrical power to the carrier drive motor 134 and the solder wave pump 136. A sensor 138 is coupled to the control stage 132 so that when the motion of the carrier is stopped or slowed for any reason, this occurrence is sensed and the control stage 132 interrupts power to the solder wave pump 136 as well as to the carrier drive motor 134. The carrier sensor 138 may be any suitable device—e.g., a photocell, a micro switch, etc. When the solder wave pump 136 stops, the solder recedes from the lower component leads which have been immersed in the solder bath and the associated components are thereby prevented from overheating. When the motion of the carrier is to be started again, the control stage 132 applies power to the solder wave pump 136 and the carrier drive motor 134. However, power to the carrier drive motor 132 is applied through a time delay stage 140 which insures that the solder wave reaches the correct height before the carrier motion begins.

The apparatus of the present invention achieves extremely precise control of the tinning process. The reeling equipment in the apparatus of FIG. 1 is capable of holding the component bodies within approximately 0.030 inch of each other. The solder wave height can be held constant, flat and smooth within 0.030 inch. One particular standard governing the position of the solder on the component leads requires the solder to be within a maximum of 0.096 inch from the component body. In the apparatus of FIG. 1, the actual wave height for the solder wave bath is maintained in the range of from 0.100 to 0.125 inch from the level of the component body. Under the influence of capillary action and the four-second immersion time in the solder wave, the solder flows up the lead an additional 0.050 inch, thus bringing it within the prescribed standard and providing improved uniformity and quality of result for the leads treated by the process of the invention.

Although there have been shown and described above specific methods and apparatus for solder tinning a component lead in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. Apparatus for solder tinning electronic component leads comprising:
   means for storing a plurality of said electronic components, each of the two component leads of each component being secured to a corresponding adjacent component lead by first and second retaining means; and
   means for moving said electronic components such that said leads are advanced through a sequence of processing stages of the apparatus whereby said leads are solder tinned, the first processing stage including means for removing said first retaining means from said leads to enable the soldering thereof, the second processing stage including means for cleaning said component leads, the third processing stage including means for applying flux to the cleaned component leads and the fourth processing stage including means for applying solder to the fluxed component leads.

2. The apparatus of claim 1 further including a fifth processing stage having means for removing the flux applied to said component leads.

3. The apparatus of claim 1 wherein said second, third and fourth processing stages each include a nozzle, said leads being moved in succession through slots formed in the nozzles and further comprising a liquid bath in which the nozzle is located, a pump for pumping the liquid through the nozzle, and means for supporting each component as it passes through said nozzle slot.

4. The apparatus of claim 1 further including a sixth processing stage having means for applying third retaining means to the leads from which said first retaining means were initially removed.

5. The apparatus of claim 4 wherein the leads of one component are held in position adjacent corresponding leads of an adjacent component by said second and third retaining means.

6. The apparatus of claim 5 wherein said electronic components are stored on a storage member at the completion of said processing stages.

7. The apparatus of claim 5 wherein said second retaining means is removed from the leads to which it is affixed to permit the soldering thereof.

8. The apparatus of claim 7 including means for applying fourth retaining means to the leads from which said second retaining means were removed subsequent to the soldering of said leads.

9. The apparatus of claim 1 wherein said moving means comprises a drive gear.

10. The apparatus of claim 1 wherein said moving means comprises oppositely disposed sprocket means, chain means drive by each of said sprocket means, a plurality of pad members coupled to said chain means, and means for applying a force to said pad members so that a portion of each component lead is forced between oppositely disposed pad members.

11. The apparatus of claim 1 wherein said first and second retaining means comprise paper tape bonded together on said component leads.

12. The apparatus of claim 8 wherein said first, second, third and fourth retaining means comprise paper tape affixed to the component leads.

13. The apparatus of claim 5 wherein the lower edge of said second retaining means is used to control the depth of the solder tin coating applied to said leads in relation to the body of said electronic components.

14. The apparatus of claim 2 further including a nozzle at each of said second, third, fourth and fifth processing stages, said leads being moved in succession through slots formed in the nozzles, the nozzle of the fourth stage establishing a smooth top surface of the solder that can be easily controlled for height adjustment in relationship to the body of said components.

15. The apparatus of claim 1 which includes electrical drive means for moving the components and electrical pump means for applying solder to the leads and further including a control stage for controlling the application of power to the respective carrier drive and solder pump means at different points in time to insure that the solder is maintained at a desired level for contacting the component leads before the carrier drive means is energized.

16. The apparatus of claim 15 including a time delay circuit for delaying activation of the carrier drive means after the solder wave pump is energized by the control stage.

17. The apparatus of claim 15 further including a sensor for monitoring movement of the carrier, the control stage being effective to interrupt the application of power to the solder wave pump upon receipt of a signal from the sensor indicating that carrier motion has been interrupted.

18. Apparatus for processing a plurality of previously fabricated electronic components to develop a solder tinned layer on the leads of said components, the components having been packaged by applying respective layers of tape to the leads and layering the tapes and components in a storage pack, the apparatus comprising:
a plurality of processing stations aligned in succession for performing selected processing steps on the individual leads as the components are transported to the stations in sequence;
means for engaging an upper layer of tape and the component leads affixed thereto while suspending the components and leads in a generally vertical orientation therefrom, the engaging means extending along a path adjacent the respective processing stations;
means adjacent said path in a position preceding the processing stations for removing the tape from the set of lower leads in sequence as the components progress along said path;
means adjacent said path in a position succeeding the processing stations for reapplying tape to the set of lower leads as the components emerge from the plurality of processing stations; and
means for driving the engaging means to transport the components along said path.

19. The apparatus of claim 18 further including means for receiving the retaped components from the tape reapplying means and placing the taped components in another storage pack.

20. The apparatus of claim 18 wherein the means for removing the tape from the first set of leads comprise a spray device for spraying solvent on the first set of leads and the tape associated therewith to dissolve the adhesive holding the tape to the leads and means for drawing the tape away from contact with the individual leads of the first set.

21. The apparatus of claim 18 wherein the plurality of processing stations comprises, in succession along said path, a station for cleaning the leads, a station for applying flux to the cleaned leads, and a solder bath station.

22. The apparatus of claim 21 further including a station succeeding the solder bath station for removing any vestiges of flux from the solder tinned leads.

23. The apparatus of claim 21 further comprising:
a nozzle positioned at said solder bath station in a hot solder bath, said nozzle having a narrow slot extending completely through the nozzle in a direction corresponding to the direction of movement of said components to receive said component leads; and
means for pumping hot solder from said bath such that the solder costs said components leads as they move through said nozzle slot.

24. The apparatus of claim 23 wherein each of said components includes first and second leads, the first leads of each electronic component being secured to corresponding first leads of adjacent components by tape means.

25. The apparatus of claim 24 further including means for supporting the lower edge of said tape means whereby a solder coat of substantially uniform height is applied to said second component leads as they move through said nozzle.

* * * * *